(12) United States Patent
Katayama et al.

(10) Patent No.: US 9,741,434 B2
(45) Date of Patent: Aug. 22, 2017

(54) RESISTANCE CHANGE MEMORY

(71) Applicants: Akira Katayama, Seoul (KR);
Masahiro Takahashi, Seongnam-si (KR); Tsuneo Inaba, Seongnam-si (KR); Hyuck Sang Yim, Seoul (KR); Dong Keun Kim, Icheon-si (KR); Byoung Chan Oh, Seoul (KR); Ji Wang Lee, Icheon-si (KR)

(72) Inventors: Akira Katayama, Seoul (KR);
Masahiro Takahashi, Seongnam-si (KR); Tsuneo Inaba, Seongnam-si (KR); Hyuck Sang Yim, Seoul (KR); Dong Keun Kim, Icheon-si (KR); Byoung Chan Oh, Seoul (KR); Ji Wang Lee, Icheon-si (KR)

(73) Assignees: SK HYNIX INC., Icheon-Si, Gyeonggi-Do (KR); KABUSHIKI KAISHA TOSHIBA, Tokyo (JP)

( * ) Notice: Subject to any disclaimer, the term of this patent is extended or adjusted under 35 U.S.C. 154(b) by 215 days.

(21) Appl. No.: 14/018,287

(22) Filed: Sep. 4, 2013

(65) Prior Publication Data

US 2014/0286075 A1    Sep. 25, 2014

Related U.S. Application Data

(60) Provisional application No. 61/804,535, filed on Mar. 22, 2013.

(51) Int. Cl.
*G11C 5/06* (2006.01)
*G11C 13/00* (2006.01)
*G11C 11/16* (2006.01)

(52) U.S. Cl.
CPC ............ *G11C 13/004* (2013.01); *G11C 11/16* (2013.01); *G11C 11/1673* (2013.01); *G11C 5/06* (2013.01); *G11C 2013/0054* (2013.01)

(58) Field of Classification Search
CPC ......... G11C 5/06; G11C 5/08; G11C 11/1673; G11C 7/14; G11C 11/4099; G11C 16/28; G11C 2013/0054
See application file for complete search history.

(56) References Cited

U.S. PATENT DOCUMENTS

| | | | |
|---|---|---|---|
| 6,535,434 B2 * | 3/2003 | Maayan | G11C 7/062 365/189.07 |
| 7,009,880 B1 * | 3/2006 | Liu | G11C 16/26 365/185.11 |

(Continued)

FOREIGN PATENT DOCUMENTS

| | | |
|---|---|---|
| JP | 2003-338185 A | 11/2003 |
| JP | 2004-046962 A | 2/2004 |
| JP | 2007-164837 A | 6/2007 |

*Primary Examiner* — Harry W Byrne
*Assistant Examiner* — R Lance Reidlinger
(74) *Attorney, Agent, or Firm* — Holtz, Holtz & Volek PC

(57) ABSTRACT

According to one embodiment, a memory includes a memory cell array including blocks arranged in a column direction, first and second main global conductive lines each extending from a first end to a second end of the memory cell array in the column direction, a first resistance change element connected between the first and second main global conductive lines inside the memory cell array, a first reference global conductive line extending from the first end to the second end of the memory cell array in the column direction, and a second resistance change element connected to the reference global conductive line outside the memory cell array.

7 Claims, 17 Drawing Sheets

(56) References Cited

U.S. PATENT DOCUMENTS

| | | | |
|---|---|---|---|
| 7,095,655 B2* | 8/2006 | Betser | G11C 7/14 |
| | | | 365/185.11 |
| 7,733,728 B2* | 6/2010 | Sudo | 365/210.1 |
| 7,787,320 B2* | 8/2010 | Ueda et al. | 365/207 |
| 8,102,695 B2* | 1/2012 | Ono et al. | 365/148 |
| 8,593,860 B2* | 11/2013 | Shu | G11C 5/063 |
| | | | 365/154 |
| 2004/0008556 A1 | 1/2004 | Hidaka | |
| 2011/0235402 A1* | 9/2011 | Ueda | G11C 7/14 |
| | | | 365/148 |
| 2013/0229861 A1* | 9/2013 | Ueda | 365/158 |

* cited by examiner

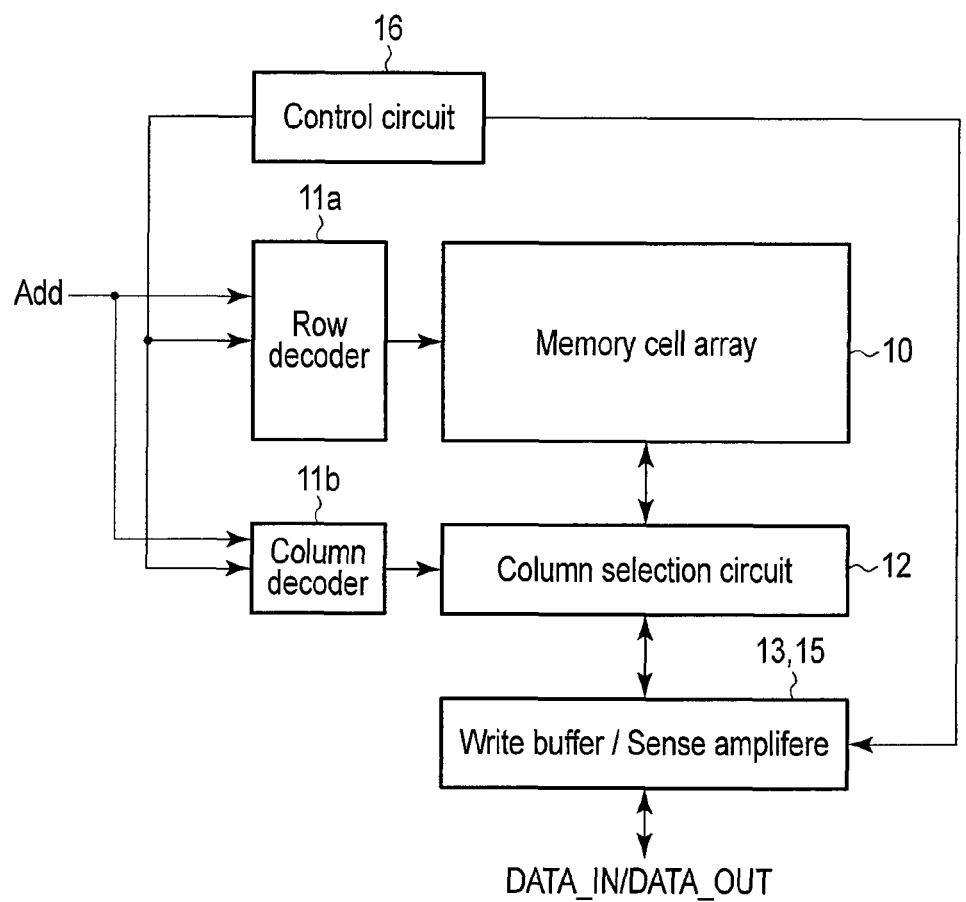
F I G. 1

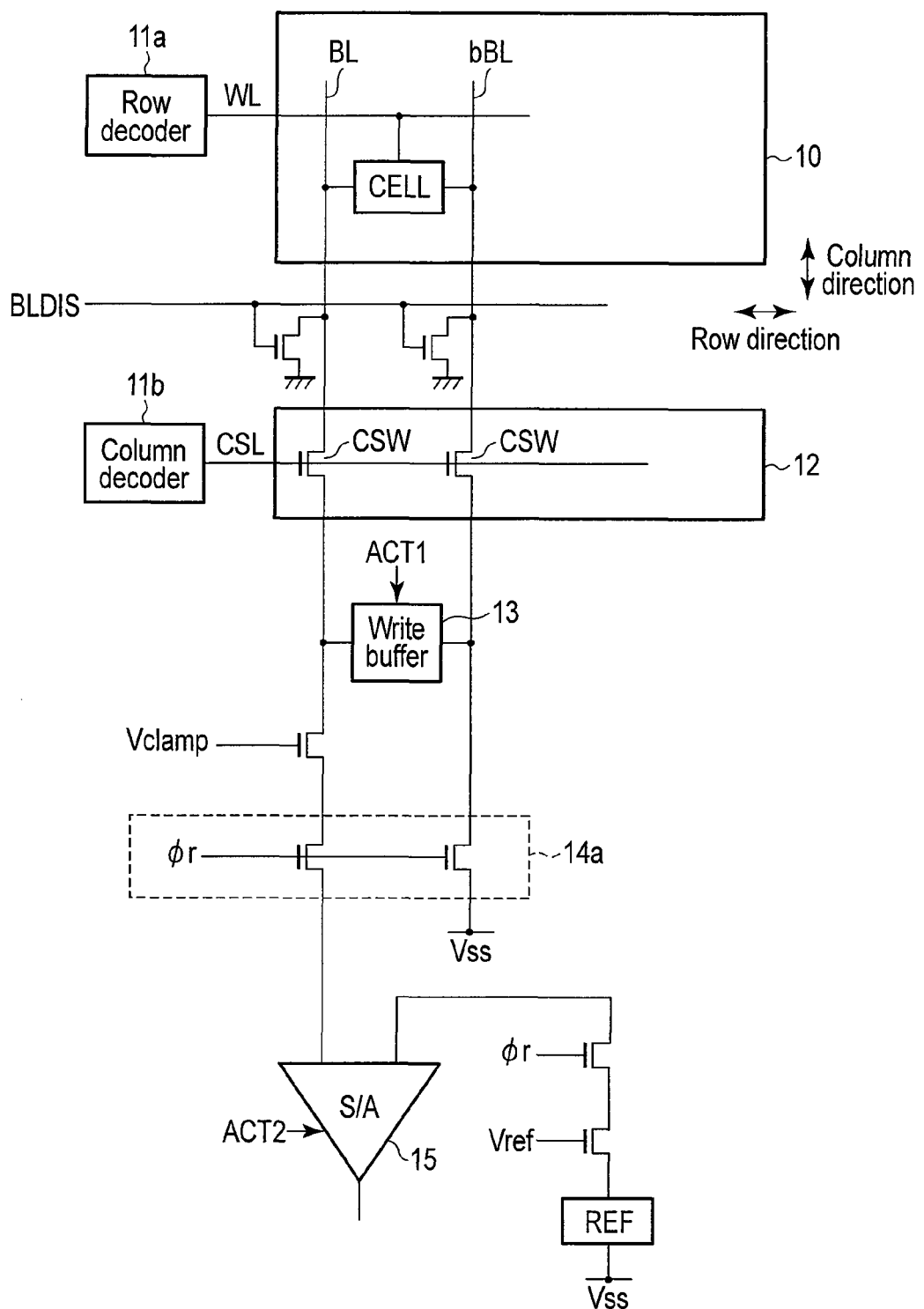
F I G. 2

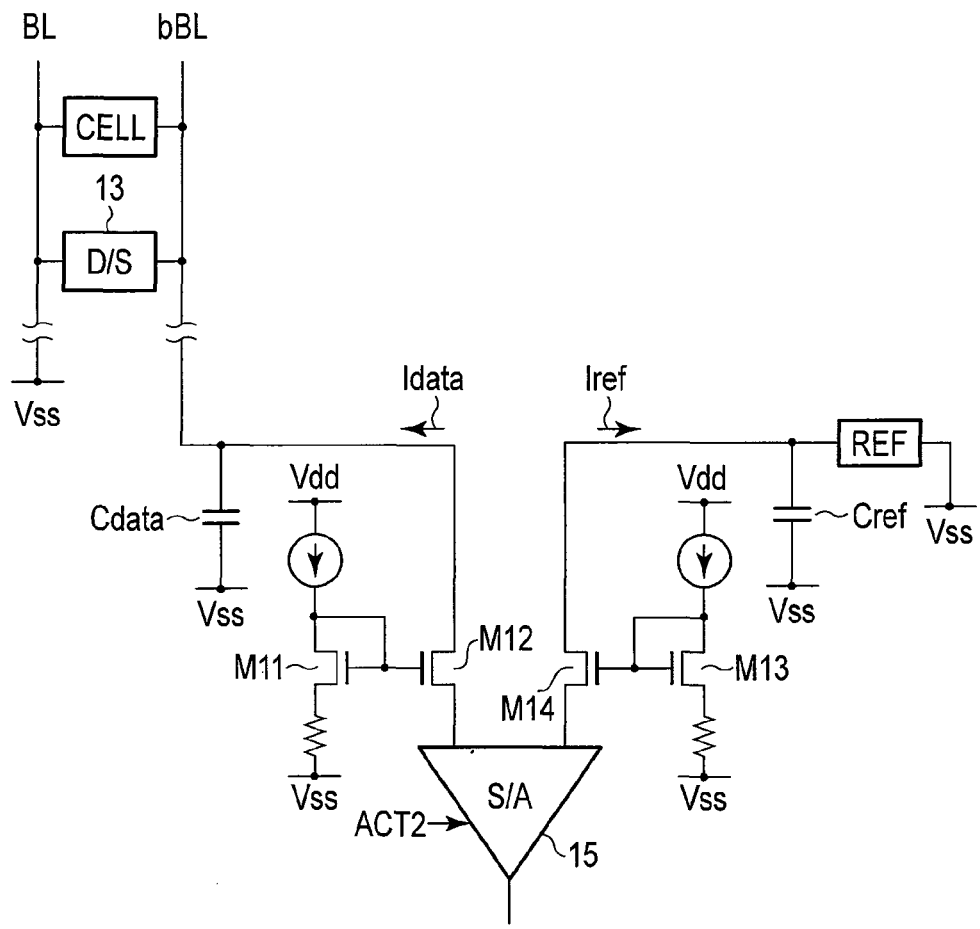
F I G. 4

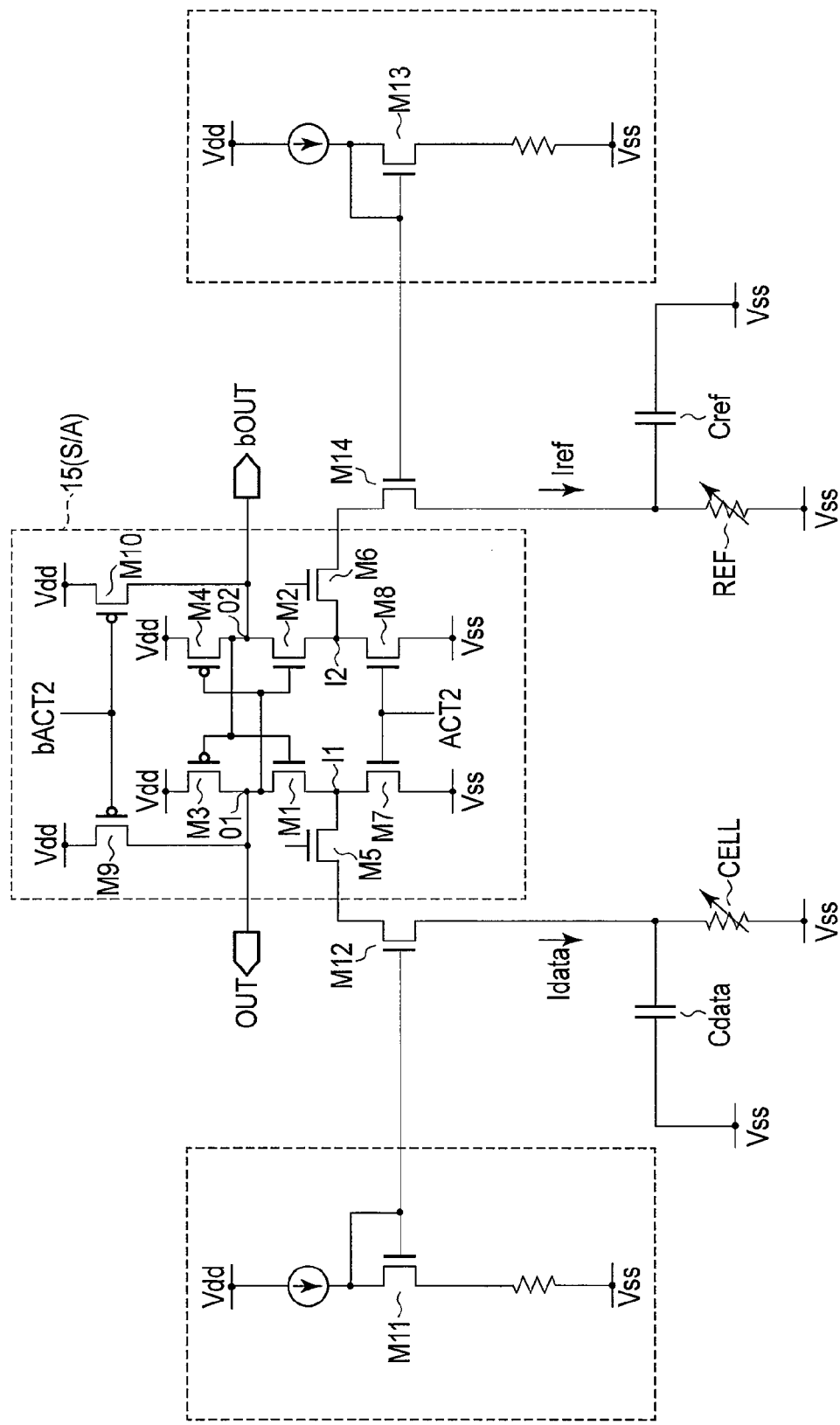
F I G. 5

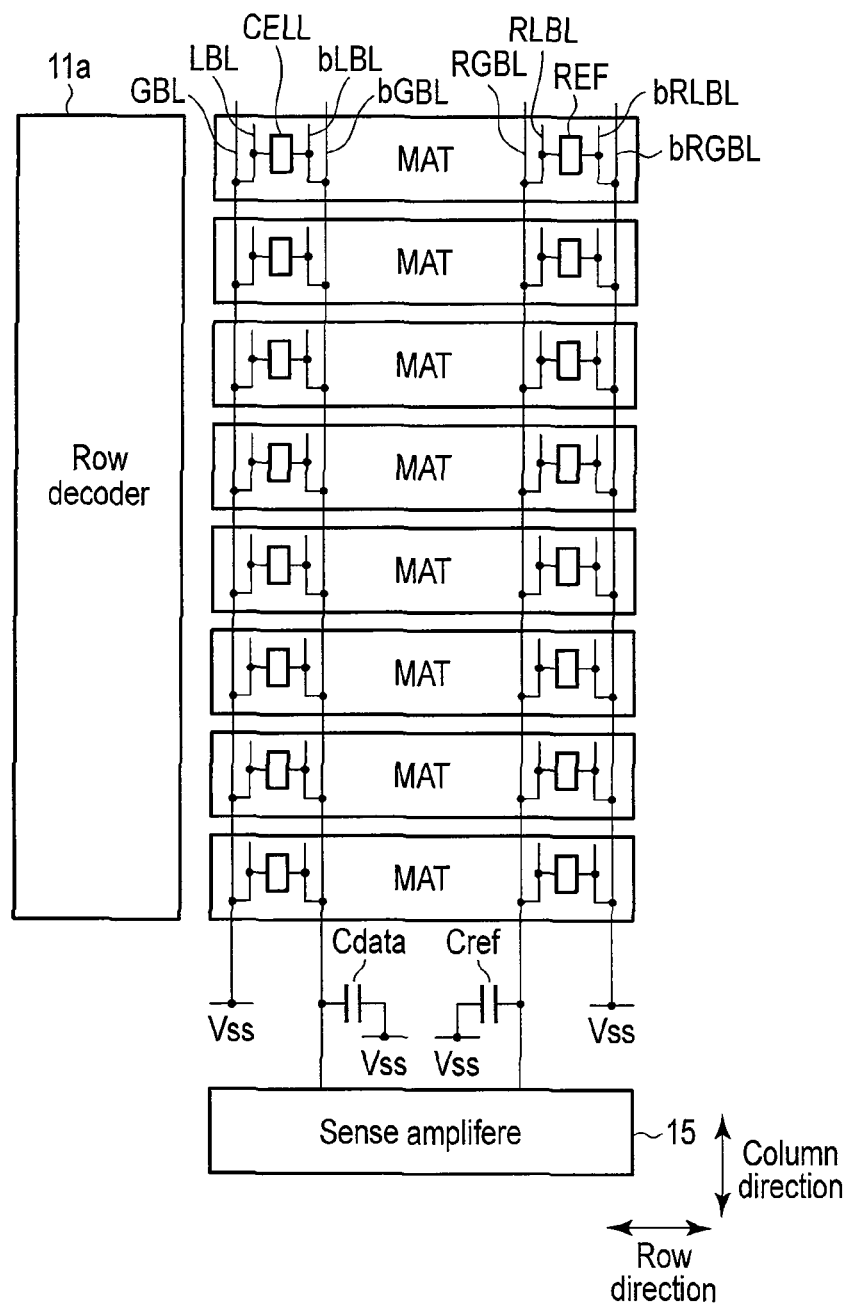
F I G. 7

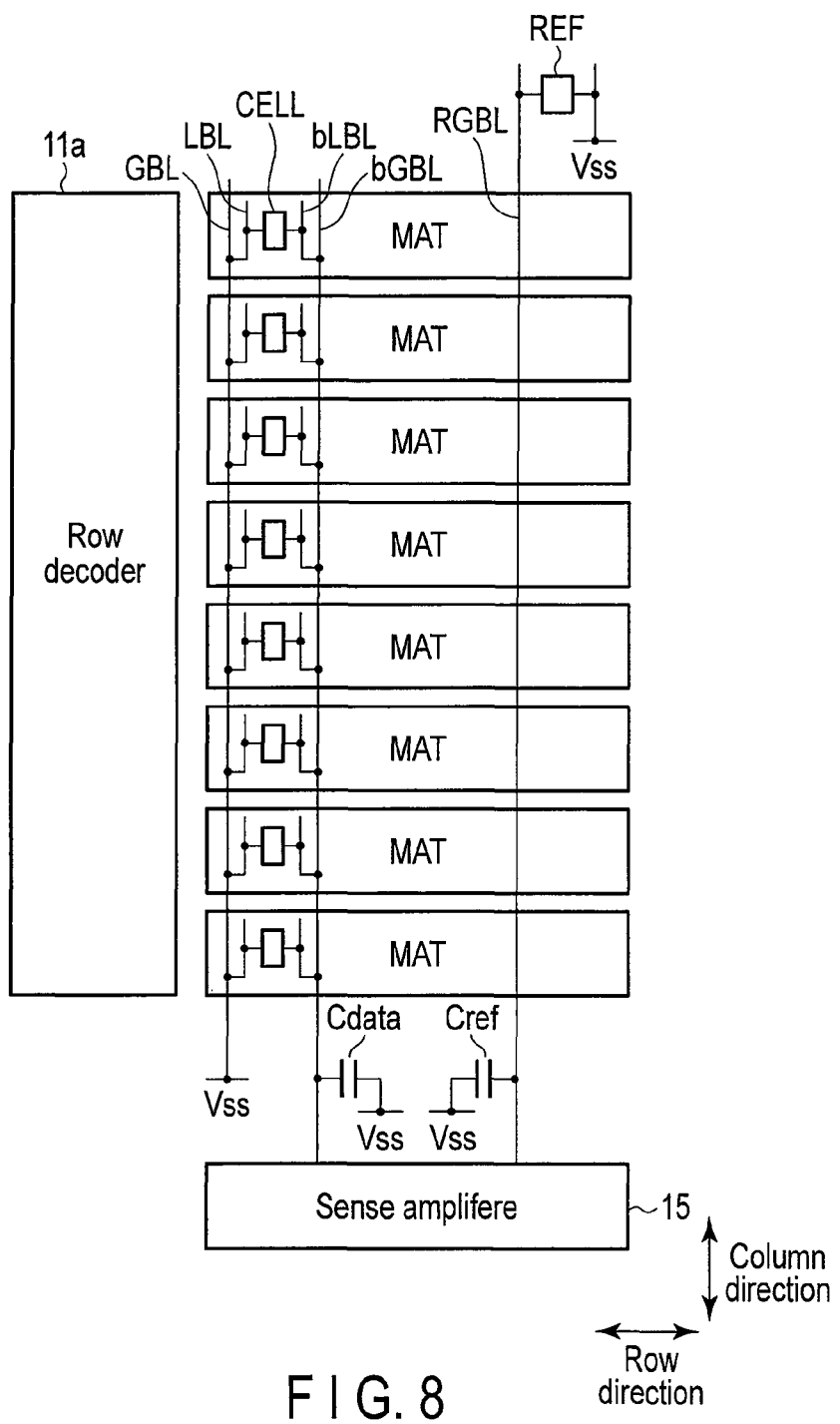
F I G. 8

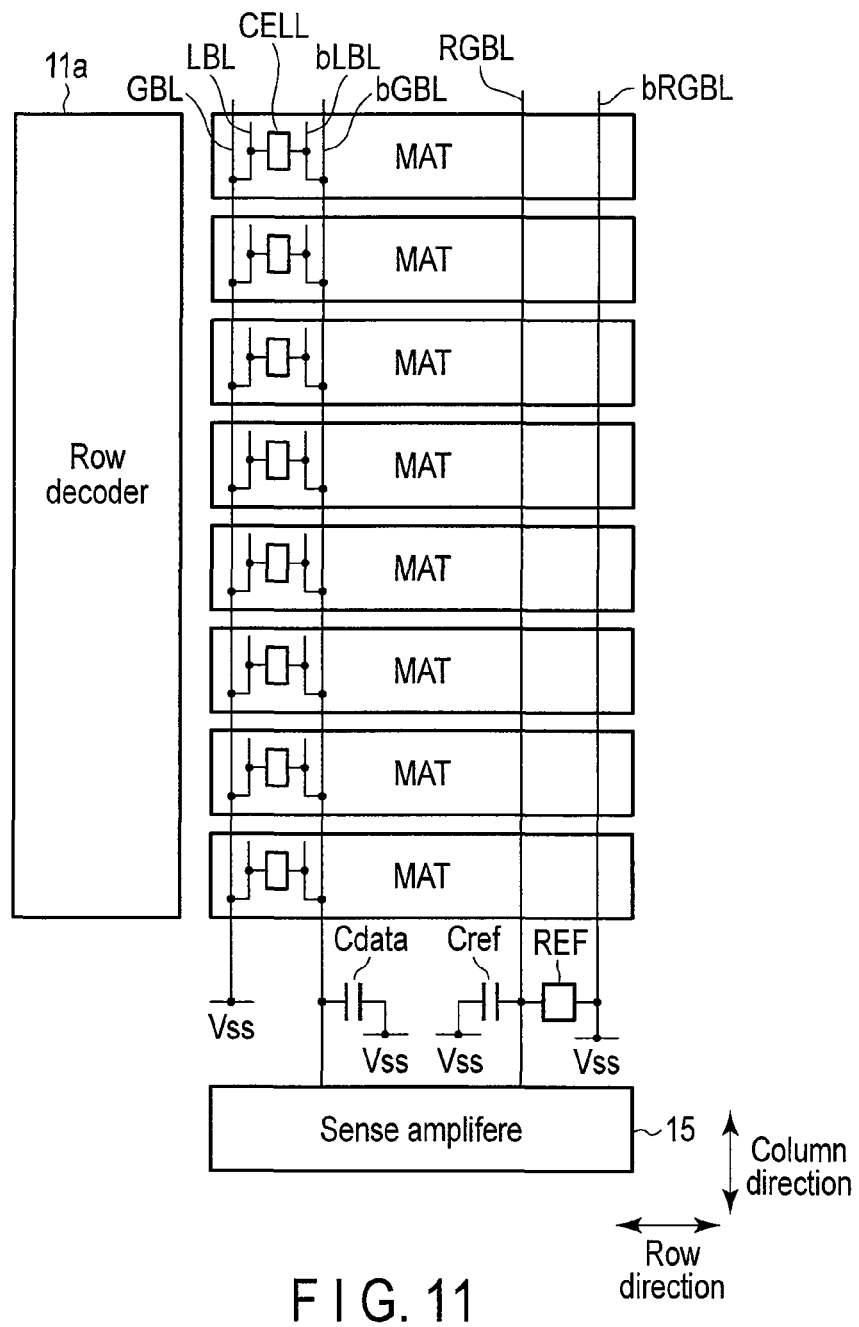
F I G. 11

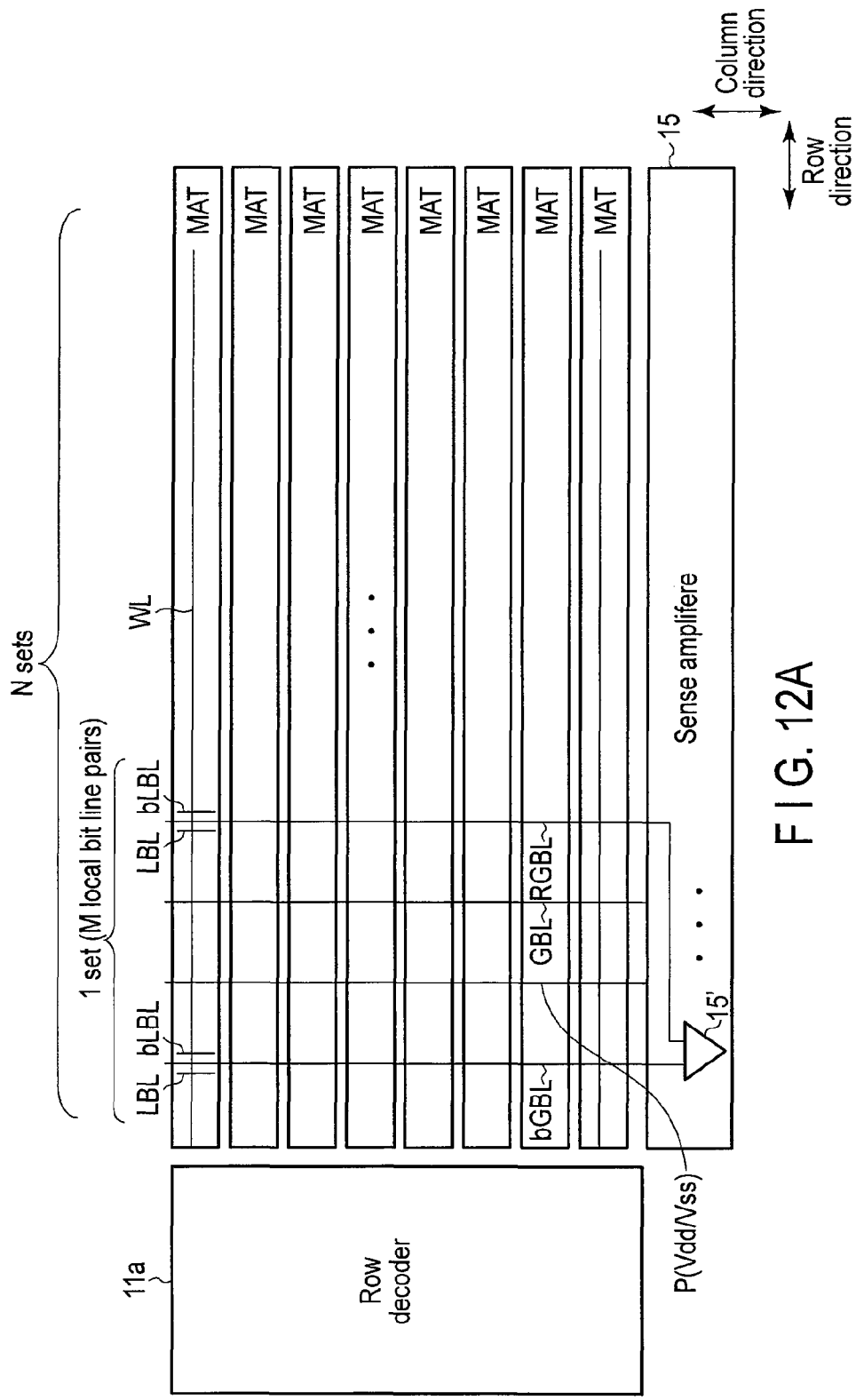
F I G. 12A

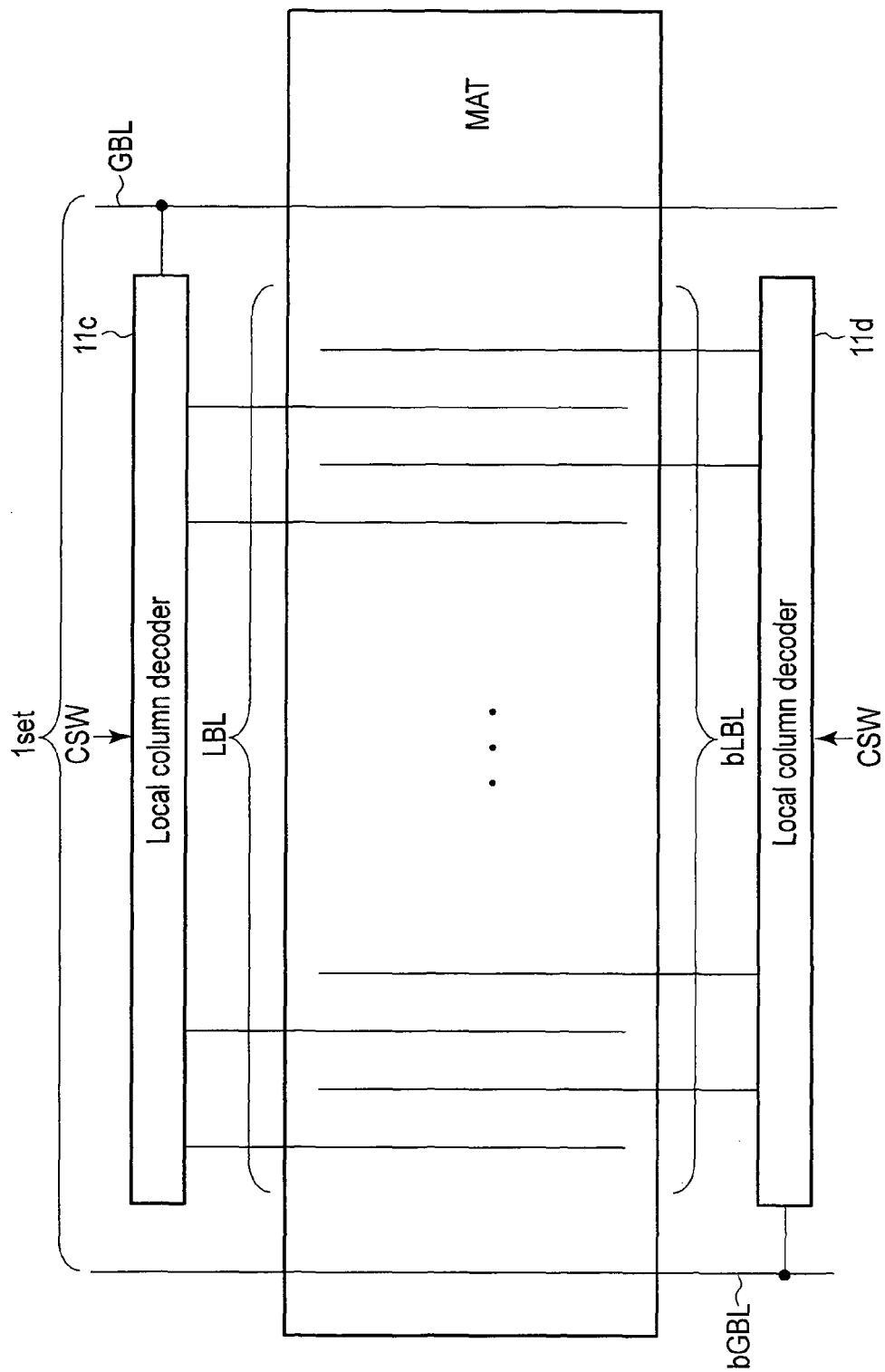
F I G. 12B

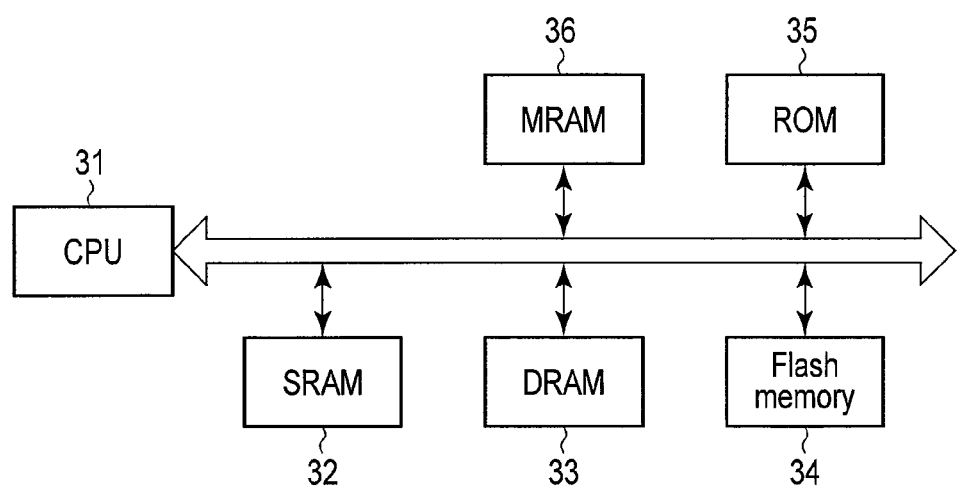
F I G. 14

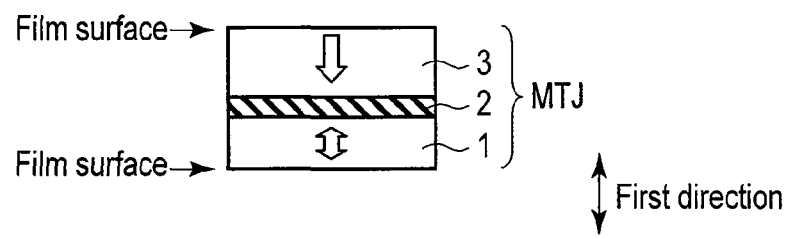
F I G. 15
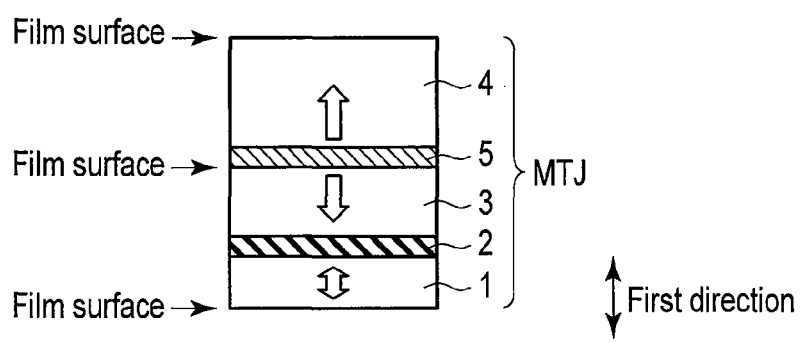
F I G. 16

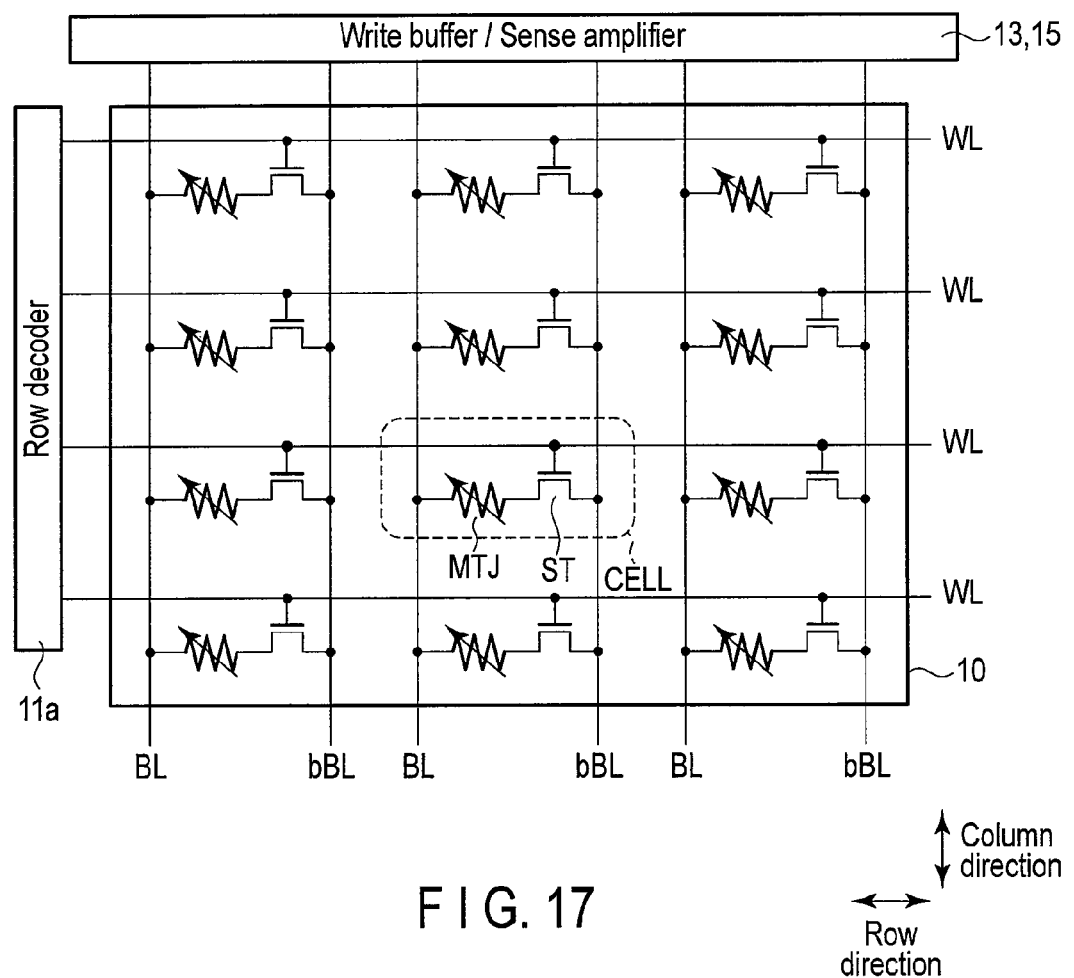
F I G. 17

RESISTANCE CHANGE MEMORY

CROSS-REFERENCE TO RELATED APPLICATIONS

This application claims the benefit of U.S. Provisional Application No. 61/804,535, filed Mar. 22, 2013, the entire contents of which are incorporated herein by reference.

FIELD

Embodiments described herein relate generally to a resistance change memory.

BACKGROUND

A resistance change memory has a thinner and longer bit line and a greater resistance value of the bit line if a memory cell is more miniaturized and the memory capacity is increased. This leads to the use of an architecture (hierarchical bit line structure) in which a memory capacity is divided into blocks, a low-resistance global bit line is disposed on these blocks, and the global bit line is connected to a local bit line in each of the blocks.

In this architecture, a read operation is performed by the use of a sense amplifier to compare a read current or a read voltage dependent on data (resistance value) stored in the memory cell with a reference current or a reference voltage. However, in this reading, the load capacity of a conductive line (global bit line) on the side of the memory cell is higher than the load capacity of a conductive line on the side of a reference cell.

Therefore, the time (latency) from a read operation instruction to the start of sensing by the sense amplifier is long.

BRIEF DESCRIPTION OF THE DRAWINGS

FIG. 1 is a general view of a resistance change memory;
FIG. 2 is a diagram showing the relation between a memory cell array, a write buffer, and a sense amplifier;
FIG. 4 and FIG. 5 are diagrams showing a configuration example of the sense amplifier;
FIG. 6 and FIG. 7 are diagrams showing layouts as comparative examples;
FIG. 8 to FIG. 11 are diagrams showing layouts as embodiments;
FIG. 12A is a diagram showing conductive layers in which reference global bit lines are disposed;
FIG. 12B is a diagram showing a local column decoder;
FIG. 14 is a diagram showing a nonvolatile cache system;
FIG. 15 and FIG. 16 are diagrams showing examples of magnetoresistive effect elements;
and
FIG. 17 is a diagram showing an example of a memory cell array of an MRAM.

DETAILED DESCRIPTION

Figure 3:
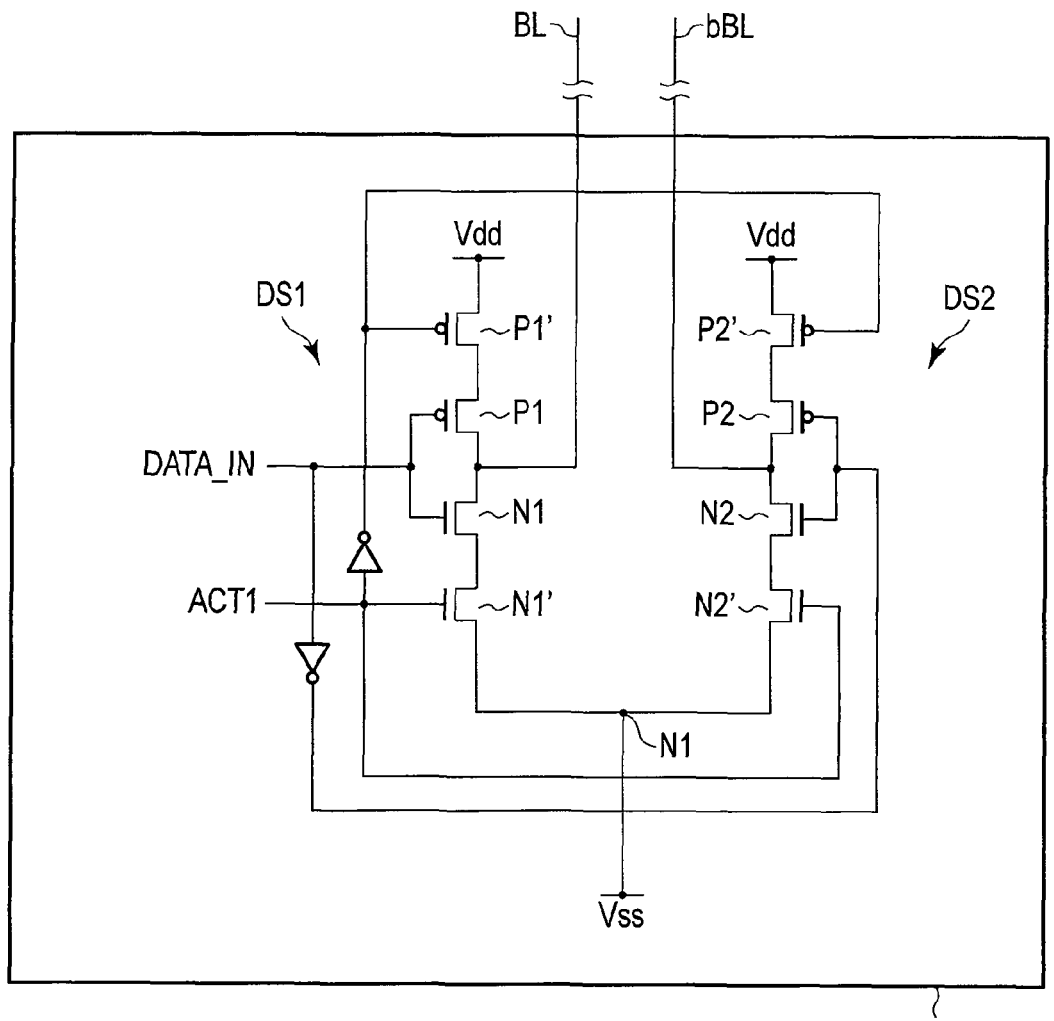
FIG. 3 is a diagram showing a configuration example of the write buffer.

In general, according to one embodiment, a resistance change memory comprises: a resistance change memory comprises: a memory cell array including blocks arranged in a column direction; first and second main global conductive lines each extending from a first end to a second end of the memory cell array in the column direction; first and second local conductive lines and a first resistance change element as a memory cell connected therebetween in each of the blocks, the first local conductive line connected to the first main global conductive line, the second local conductive line connected to the second main global conductive line; a first reference global conductive line extending from the first end to the second end of the memory cell array in the column direction; a second resistance change element as a reference cell connected to the reference global conductive line outside the memory cell array; and a sense amplifier connected to the first main global conductive line and the first reference global conductive line, and which reads data from the first resistance change element by comparing a first read current flowing the first resistance change element with a second read current flowing the second resistance change element in a reading.

Hereinafter, an embodiment will be described with reference to the drawings.

[Overview]

The embodiment below concerns a resistance change memory (e.g. magnetic random access memory: MRAM) having a hierarchical bit line structure.

The resistance change memory includes a memory cell array which includes blocks arranged in a column direction, first and second main global bit lines extending from a first end to a second end of the memory cell array in the column direction, first and second local bit lines which are disposed in each of the blocks and which extend in the column direction, and a first resistance change element as a memory cell connected between the first and second local bit lines.

The first and second main global bit lines are greater in width than the first and second local bit lines, respectively.

The resistance change memory further includes a first reference global bit line extending from the first end to the second end of the memory cell array in the column direction, and a second resistance change element as a reference cell connected to the reference global bit line outside the memory cell array.

The resistance change memory may further include a second reference global bit line extending from the first end to the second end of the memory cell array in the column direction. In this case, the second resistance change element is connected between the first and second reference global bit lines.

Thus, in a reading, the load capacity of the bit line on the side of the memory cell and the load capacity of the bit line on the side of the reference cell are set to be substantially the same load capacity. When the load capacities of both the bit lines are the same, the time (latency) from a read operation instruction to the start of sensing by a sense amplifier can be reduced. This will be described in detail in the embodiment.

Therefore, a read time can be reduced, and a current consumed in a reading can also be reduced.

While the positional relation between the sense amplifier and the second resistance change element is not particularly limited here, the following case is conceivable.

For example, the sense amplifier is disposed at the first end of the memory cell array in the column direction, and the second resistance change element is disposed at the second end of the memory cell array in the column direction. Both the sense amplifier and the second resistance change element may otherwise be disposed at the first end of the memory cell array in the column direction.

When the resistance change memory includes the first and second reference global bit lines, the positional relation between the sense amplifier and the second resistance change element is as follows.

For example, the sense amplifier is disposed at the first end of the memory cell array in the column direction, and the second resistance change element is disposed at the second end of the memory cell array in the column direction. Both the sense amplifier and the second resistance change element may otherwise be disposed at the first end of the memory cell array in the column direction.

The first and second reference global bit lines are not connected to local bit lines corresponding to the first and second local bit lines in the memory cell array. This is mainly intended to eliminate a full replica structure in which the reference cell is disposed in the memory cell array and in which the layout on the side of the reference cell is exactly the same as the layout on the side of the memory cell.

This is attributed to the fact that the full replica structure has the disadvantage of an increased area in the memory cell array when the memory capacity is constant and that the full replica structure has the disadvantage of a decreased memory capacity when the area of the memory cell array is constant.

In this example, a load capacity applied to the side of the reference cell (second resistance change element) is a load capacity corresponding to the first and second main global bit lines on the side of the memory cell (first resistance change element).

For example, when the first reference global bit line is provided on the side of the reference cell, the load capacity of the first reference global bit line is substantially the same as the load capacities of the first and second main global bit lines.

When the first and second reference global bit lines are provided on the side of the reference cell, the load capacities of the first and second reference global bit lines are substantially the same as the load capacities of the first and second main global bit lines.

The first and second main global bit lines and the first (and second) reference global bit line are disposed in a single wiring layer. This single wiring layer is preferably a wiring layer including a first power supply line having a power supply voltage and a second power supply line having a ground voltage. The reference cell is disposed outside the memory cell array.

This can bring about advantages such as the reduction of the read time and the reduction of a current consumed in the read operation without disadvantages such as the increase of the area of the memory cell array or the decrease of the memory capacity.

The resistance change element is, for example, a magnetoresistive effect element. The magnetoresistive effect element includes a magnetic pinned layer invariable in magnetization direction, a magnetic free layer variable in magnetization direction, and a tunnel barrier layer between the magnetic pinned layer and the magnetic free layer.

Embodiment

FIG. 1 shows major parts of a resistance change memory.

A memory cell array 10 includes an array of resistance change elements (memory cells). A row decoder 11a and a column decoder 11b randomly access the resistance change elements in the memory cell array 10 in accordance with an address signal Add.

A column selection switch 12 serves to electrically connect the memory cell array 10 and a write buffer 13/a sense amplifier 15 to each other in accordance with a signal from the column decoder 11b.

The write buffer 13 writes data DATA_IN into the resistance change elements by passing a write current through the resistance change elements in the memory cell array 10 in a writing. The sense amplifier 15 reads data DATA_OUT from the resistance change elements by passing a read current through the resistance change elements in the memory cell array 10 in a reading.

A control circuit 16 controls the operations of the row decoder 11a, the column decoder 11b, and the write buffer 13/sense amplifier 15.

FIG. 2 shows the relation between the memory cell array, the write buffer, and the sense amplifier.

A unit cell CELL in the memory cell array 10 includes, for example, a resistance change element and a select transistor (FET) that are connected in series. A gate terminal of the select transistor is connected to a word line WL. The word line WL extends in a row direction, and is connected at one end to the row decoder 11a.

The unit cell CELL has one end connected to a bit line BL and the other end connected to a bit line bBL. Both the bit lines BL and bBL extend in a column direction, and are connected at one end to the write buffer 13 and the sense amplifier 15 via column selection transistors (FET) CSW.

Gate terminals of the column selection transistors CSW are connected to the column decoder 11b. The on/off of the column selection transistors CSW is controlled by a column selection signal CSL from the column decoder 11b.

The write buffer 13 is activated by an activation signal ACT1. The write buffer 13 is a driver/sinker which supplies a write current to the resistance change element in the unit cell CELL. The write buffer changes the direction of the write current in accordance with, for example, the value of data.

A switching circuit 14a electrically shuts off the bit lines BL and bBL and the sense amplifier 15 in a writing. That is, when a control signal ϕr is "L", an N-channel FET in the switching circuit 14a is switched off. The switching circuit 14a electrically connects the bit lines BL and bBL and the sense amplifier 15 in a reading. That is, when the control signal ϕr is "H", the N-channel FET in the switching circuit 14a is switched on.

The N-channel FET to which a clamp signal Vclamp is input has a function to clamp the bit line BL at a constant voltage in a reading.

The sense amplifier 15 is activated by an activation signal ACT2. The sense amplifier 15 supplies a read current to the resistance change element in the unit cell CELL, and passes a reference current through a reference cell in a reference cell REF, thereby reading data stored in the resistance change element.

Here, as both Vref and ϕr are "H" on the side of the reference cell REF in a reading, the N-channel FET to which Vref and ϕr are input is switched on.

FIG. 3 shows a configuration example of the write buffer 13 in FIG. 2.

The write buffer 13 includes write drivers/sinkers DS1 and DS2. The write driver/sinker DS1 is connected to one end of the bit line BL. The write driver/sinker DS2 is connected to one end of the bit line bBL.

The write driver/sinker DS1 includes, for example, two P-channel FETs P1 and P1' and two N-channel FETs N1 and N1' connected in series between a power supply terminal Vdd and a ground terminal Vss.

The write driver/sinker DS2 includes, for example, two P-channel FETs P2 and P2' and two N-channel FETs N2 and N2' connected in series between the power supply terminal Vdd and the ground terminal Vss.

For example, when the activation signal ACT1 is "H", the drivers/sinkers DS1 and DS2 are activated.

Thus, when the write data DATA_IN is "H" (="1"), a write current directed from the driver/sinker DS2 to the driver/sinker DS1 flows through the unit cell CELL. When the write data DATA_IN is "L" (="0"), a write current directed from the driver/sinker DS1 to the driver/sinker DS2 flows through the unit cell CELL.

For example, when the activation signal ACT1 is "L", the drivers/sinkers DS1 and DS2 are non-activated.

FIG. 4 and FIG. 5 show a configuration example of the sense amplifier 15 in FIG. 2.

The sense amplifier 15 in this example is a current differential sense amplifier.

The sense amplifier 15 has a flip-flop circuit including N-channel FETs M1 and M2 and P-channel FETs M3 and M4.

The N-channel FET M1 has a drain connected to an output node O1, a gate connected to an output node O2, and a source connected to an input node I1. The N-channel FET M2 has a drain connected to the output node O2, a gate connected to the output node O1, and a source connected to an input node I2.

The P-channel FET M3 has a drain connected to the output node O1, a gate connected to the output node O2, and a source connected to the power supply terminal Vdd. The P-channel FET M4 has a drain connected to the output node O2, a gate connected to the output node O1, and a source connected to the power supply terminal Vdd.

N-channel FETs M5 and M12 are connected between the input node I1 and the unit cell (memory cell) CELL. N-channel FETs M6 and M14 are connected between the input node I2 and the reference cell REF.

N-channel FETs M7 and M8 are switched on when the activation signal ACT2 is "H", and activate the sense amplifier 15 (S/A). P-channel FETs M9 and M10 are switched on when an activation signal bACT2 is "L", and activate the sense amplifier 15 (S/A). The activation signal bACT2 is an inversion signal of the activation signal ACT2.

N-channel FETs M11 and M12 are current mirror circuits. N-channel FETs M13 and M14 are current mirror circuits.

A sense operation is started after the activation signal ACT2 is set to "H" from "L". A cell current Idata discharges the output node O1 via the input node I1. Similarly, a reference current Iref discharges the output node O2 via the input node I2.

The discharge rate of the output node O1 and the discharge rate of the output node O2 change in accordance with the difference between the cell current Idata and the reference current Iref. Therefore, this difference is amplified by the flip-flop circuit, and the voltages of the output nodes O1 and O2 are determined.

Here, if a load capacity Cdata of a conductive line (main global bit line in particular) on the side of the memory cell is different from a load capacity Cref of a conductive line on the side of the reference cell in a reading, there will be a difference between the rise rate of the read current Idata flowing through the memory cell and the fall rate of the reference current Iref flowing through the reference cell.

Here, the rise rate is the time from the start of the passage of a current through the memory cell or the reference cell to the stabilization of the value of the current flowing through the memory cell or the reference cell.

Figure 13:
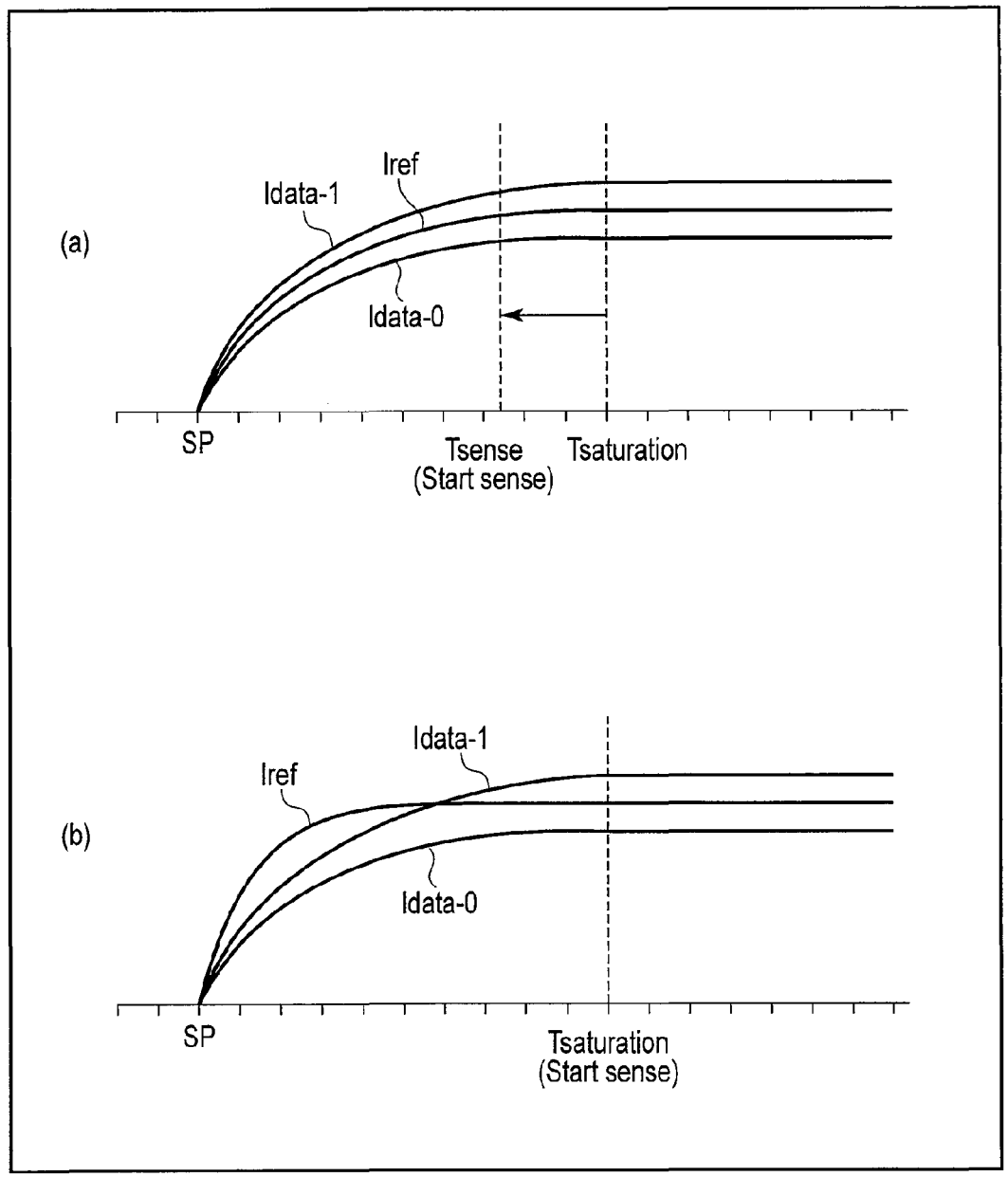
FIG. 13 is a diagram showing the reduction of latency.

In this case, for example, as shown in (b) of FIG. 13, an extremely long saturation time Tsaturation is required before the reference current Iref is located with a sufficient margin between a cell current Idata-1 flowing through the memory cell in a high-resistance state ("1" state) and a cell current Idata-0 flowing through the memory cell in a low-resistance state ("0" state), that is, before the start of sensing is possible.

Accordingly, the present embodiment suggests a layout to set the load capacity Cdata of the conductive line on the side of the memory cell and the load capacity Cref on the side of the reference cell to substantially the same load capacity in a reading. If both the load capacities Cdata and Cref are the same, the time (latency) from a read operation instruction to the start of sensing by the sense amplifier can be reduced.

Therefore, a read time can be reduced, and a current consumed in a reading can also be reduced.

Figure 6:
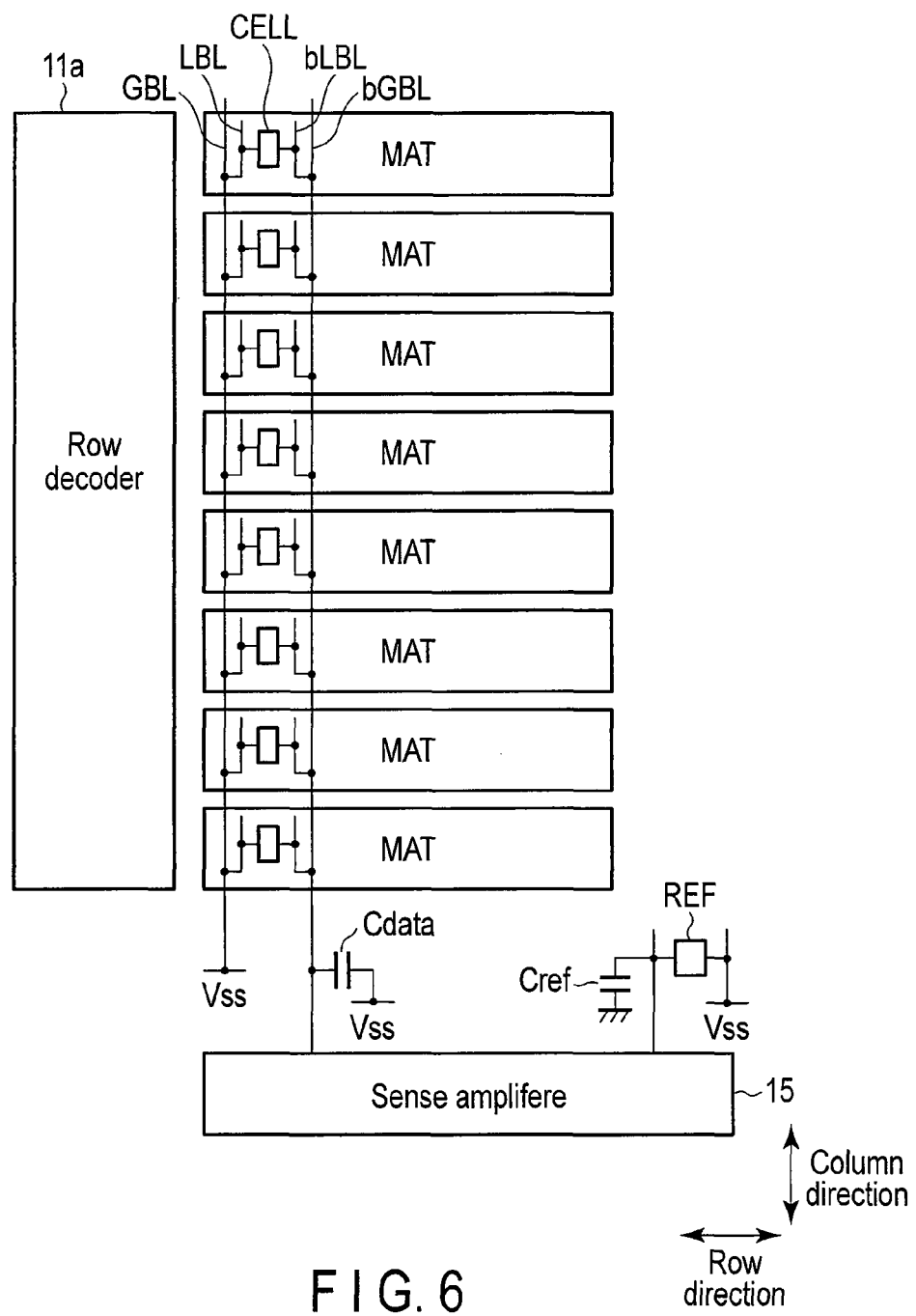

FIG. 6 and FIG. 7 show layouts as comparative examples.

A memory cell array includes blocks MAT arranged in a column direction.

Main global bit lines BL and bBL extend from a first end to a second end of the memory cell array in the column direction. Local bit lines LBL and bLBL are disposed in each of the blocks, and extend in the column direction. The local bit line LBL is connected to a main global bit line GBL. The local bit line bLBL is connected to a main global bit line bGBL. A cell unit (memory cell) CELL is connected between the local bit lines LBL and bLBL.

In the example shown in FIG. 6, the layout on the side of the reference cell REF does not replicate the layout on the side of the cell unit (memory cell) CELL. That is, conductive lines corresponding to the global bit lines GBL and bGBL are not connected between the sense amplifier 15 and the reference cell REF. Therefore, the load capacity Cdata of the conductive line on the side of the memory cell is higher than the load capacity Cref on the side of the reference cell.

In the example shown in FIG. 7, the layout on the side of the reference cell REF replicates the layout on the side of the cell unit (memory cell) CELL.

That is, reference global bit lines RGBL and bRGBL extend from the first end to the second end of the memory cell array in the column direction. Reference local bit lines RLBL and bRLBL are disposed in each of the blocks, and extend in the column direction. The reference local bit line RLBL is connected to a reference global bit line RGBL. The reference local bit line bRLBL is connected to a reference global bit line bRGBL.

The reference cell unit (reference cell) REF is connected between the reference local bit lines RLBL and bRLBL. However, the reference cell unit (reference cell) REF may be shared by blocks MAT and disposed outside the memory cell array.

In the example shown in FIG. 7, the load capacity Cref on the side of the reference cell is about the same as the load capacity Cdata of the conductive line on the side of the memory cell. However, the reference cell REF replicates the cell unit (memory cell) CELL. Thus, there is a disadvantage of an increased area in the memory cell array when the memory capacity is constant, whereas there is a disadvantage of a decreased memory capacity when the area of the memory cell array is constant.

FIG. 8 to FIG. 11 show layouts as embodiments.

This layout is characterized in that the layout on the side of the reference cell REF only replicates the main global bit line in the layout on the side of the cell unit (memory cell) CELL. This is attributed to the fact that most of the load capacity Cdata on the side of the memory cell originates from the main global bit line.

Figure 9:
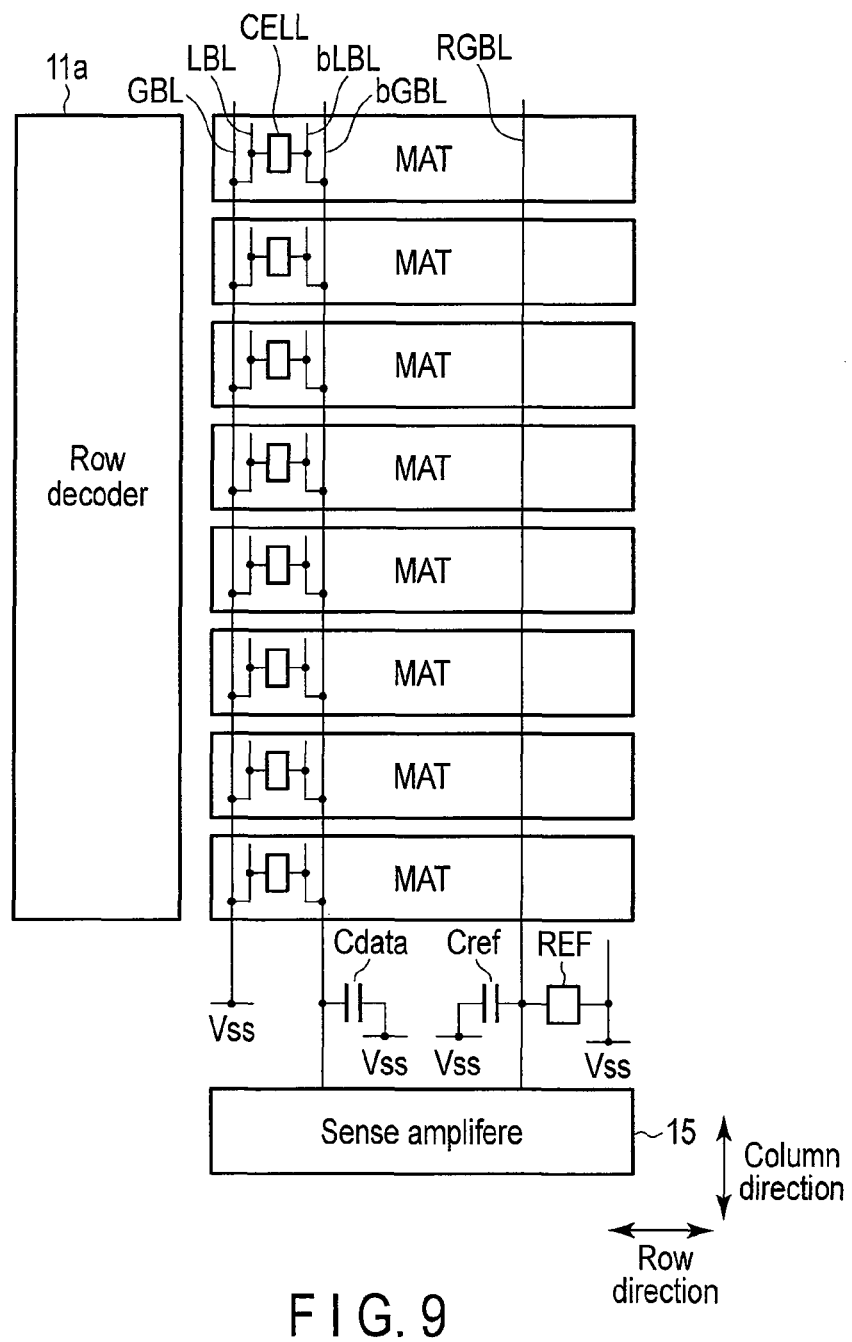

In the example shown in FIG. 8 and FIG. 9, the layout on the side of the reference cell REF only replicates the main global bit line GBL in the layout on the side of the cell unit (memory cell) CELL.

That is, the reference global bit line RGBL extends from the first end to the second end of the memory cell array in the column direction. The reference global bit line RGBL is not connected to conductive lines corresponding to the local bit lines LBL and bLBL in the memory cell array (blocks MAT).

The reference cell unit (reference cell) REF is connected to the reference global bit line RGBL outside the memory cell array. The load capacity Cref of the reference global bit line RGBL is set to be substantially the same as the load capacity Cdata of the main global bit lines GBL and bGBL.

In the example shown in FIG. 8, the sense amplifier 15 is disposed at the first end of the memory cell array in the column direction, and the reference cell unit REF is disposed at the second end of the memory cell array in the column direction. In the example shown in FIG. 9, both the sense amplifier 15 and the reference cell unit REF are disposed at the first end of the memory cell array in the column direction.

Figure 10:
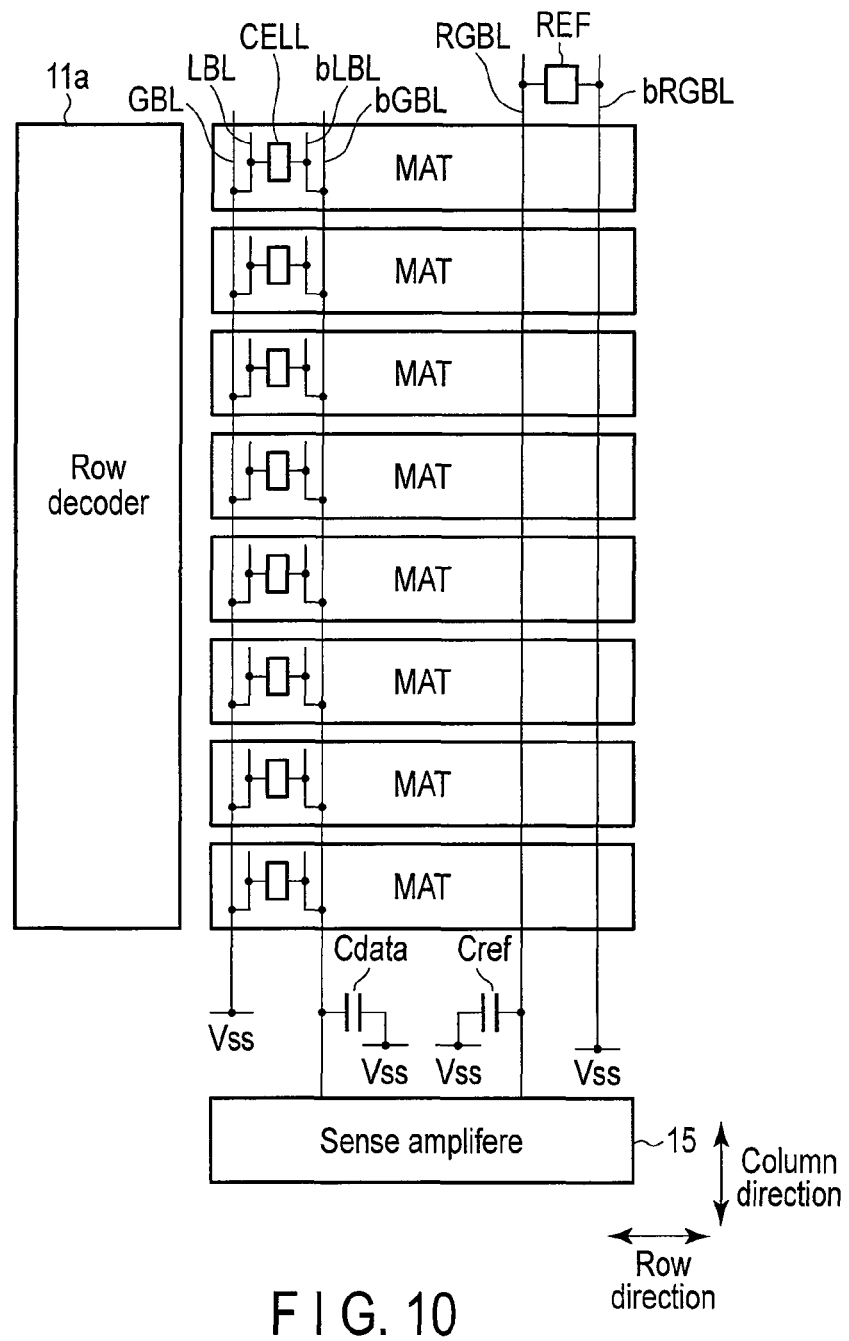

In the example shown in FIG. 10 and FIG. 11, the layout on the side of the reference cell REF replicates the main global bit lines GBL and bGBL in the layout on the side of the cell unit (memory cell) CELL.

That is, the reference global bit lines RGBL and bRGBL extend from the first end to the second end of the memory cell array in the column direction. The reference global bit lines RGBL and bRGBL are not connected to conductive lines corresponding to the local bit lines LBL and bLBL in the memory cell array (blocks MAT).

The reference cell unit (reference cell) REF is connected to the reference global bit lines RGBL and bRGBL outside the memory cell array. The load capacity Cref of the reference global bit lines RGBL and bRGBL is set to be substantially the same as the load capacity Cdata of the main global bit lines GBL and bGBL.

In the example shown in FIG. 10, the sense amplifier 15 is disposed at the first end of the memory cell array in the column direction, and the reference cell unit REF is disposed at the second end of the memory cell array in the column direction. In the example shown in FIG. 11, both the sense amplifier 15 and the reference cell unit REF are disposed at the first end of the memory cell array in the column direction.

FIG. 12A shows an example of wiring layers on the memory cell array.

First, second, and third wiring layers are arranged in this order from the bottom to the top, for example, on mats MAT as a memory cell array. The number of mats MAT is eight in this example, but is not limited thereto. However, the number of mats MAT is preferably $2^x$ (x is a natural number), for example, 32.

A first wiring layer (e.g. metallic layer) M0 includes local bit lines LBL and bLBL extending in the column direction. A second wiring layer (e.g. metallic layer) M1 includes word lines WL extending in the row direction.

A third wiring layer (e.g. metallic layer) M2 includes main global bit lines GBL and bGBL extending in the column direction, a reference global bit line RGBL extending in the column direction, and power supply lines P (Vdd/Vss) having a power supply voltage Vdd/Vss and extending in the column direction.

N sets (N is a natural number of 2 or more), for example, 16 sets are arranged in the third wiring layer M2 in the row direction. Each set includes a total of four conductive lines: two main global bit lines GBL and bGBL, one reference global bit line RGBL, and one power supply line P (Vdd/Vss).

The order of the conductive lines in each set is not particularly limited. In this example, the main global bit line bGBL, the power supply line P (Vdd/Vss), the main global bit line GBL, and the reference global bit line RGBL are arranged in this order from left to right.

The power supply line P (Vdd/Vss) in one set has one of the power supply voltage Vdd as a high voltage and the power supply voltage Vss as a low voltage. For example, the power supply voltage Vdd can be applied to the power supply lines P (Vdd/Vss) in the odd sets, and the power supply voltage Vss can be applied to the power supply lines P (Vdd/Vss) in the even sets.

For example, the main global bit line bGBL and the reference global bit line RGBL in one set are connected to a sense amplifier 15' corresponding to this set.

In this example, four conductive lines, that is, two main global bit lines GBL and bGBL, one reference global bit line RGBL, and one power supply line P (Vdd/Vss) are arranged in one set.

Alternatively, more than four conductive lines may be provided in one set if possible in regard to layout.

For example, a total of five conductive lines may be arranged in one set: two main global bit lines GBL and bGBL, two reference global bit lines RGBL and bRGBL, and one power supply line P (Vdd/Vss).

Alternatively, a total of six conductive lines may be arranged in one set: two main global bit lines GBL and bGBL, two reference global bit lines RGBL and bRGBL, and two power supply lines P (Vdd/Vss).

One set is provided to correspond to, for example, M (M is a natural number) local bit lines LBL and bLBL. M is, for example, 16.

In this case, for example, as shown in FIG. 12B, M local bit lines LBL in one set is connected to the main global bit line GBL via a local column decoder 11c, and M local bit lines bLBL in one set is connected to the main global bit line bGBL via a local column decoder 11d.

The local column decoders 11c and 11d select one local bit line LBL and one local bit line bLBL in one set in accordance with a local bit line selection signal CSW, and electrically connect the selected local bit lines LBL and bLBL to the global bit line pair GBL and bGBL.

FIG. 13 shows the advantageous effects of the reduction of the read time according to the present embodiment.

In the present embodiment, the load capacity Cdata of the conductive line on the side of the memory cell and the load capacity Cref on the side of the reference cell are set to substantially the same load capacity in a reading.

Therefore, as shown in (a) of FIG. 13, the value of the reference current Iref is always located between the cell current Idata-1 flowing through the memory cell in a high-resistance state ("1" state) and the cell current Idata-0 flowing through the memory cell in a low-resistance state ("0" state) after the start of the passage of a current through the memory cell and the reference cell (after a start point SP).

Thus, the sensing start point does not need to wait for the time Tsaturation at which the reference current Iref and the cell current Idata-1/Idata-0 are saturated. That is, the sense operation can be started before the saturation time Tsaturation. This can reduce the time (latency) from the read operation instruction to the start of the sensing operation.

In contrast, if the load capacity Cref on the side of the reference cell is extremely low in a reading, the reference current Iref is immediately saturated, whereas the cell current Idata-1/Idata-0 flowing through the memory cell is not easily saturated, as shown in (b) of FIG. 13. Accordingly, an extremely long saturation time Tsaturation is required before the reference current Iref is located with a sufficient margin between the cell current Idata-1 flowing through the memory cell in a high-resistance state ("1" state) and the cell current Idata-0 flowing through the memory cell in a low-resistance state ("0" state), that is, before the start of sensing is possible.

Thus, the present embodiment surpasses conventional arts in the reduction of the read time and in the resulting reduction of a current consumed in a reading.

Application Example

The resistance change memory according to the present embodiment described above is applicable to, for example, a cache memory in a low-power-consumption processor.

For example, the problem of a conventional resistance change memory simply used as a cache memory is that it consumes a greater amount of current particularly in a reading than an SRAM cache memory (SRAM cache).

In contrast, the load capacity on the side of the memory cell is substantially equal to the load capacity on the side of the reference cell in a reading in the resistance change memory according to the present embodiment. Therefore, the read time (latency) can be reduced, and the reading rate can be improved.

Consequently, the resistance change memory (e.g. MRAM cache) in this example can consume low power equal to or less than the power consumed by the SRAM cache in a reading.

FIG. 14 shows an example of memories in a processor.

A CPU 31 controls an SRAM 32, a DRAM 33, a flash memory 34, a ROM 35, and an MRAM (magnetic random access memory) 36.

The MRAM 36 can be used in place of any one of the SRAM 32, the DRAM 33, the flash memory 34, and the ROM 35. Accordingly, at least one of the SRAM 32, the DRAM 33, the flash memory 34, and the ROM 35 may be omitted.

The MRAM 36 can be used as a nonvolatile cache (e.g. L2 cache).

FIG. 15 shows the basic structure of a magnetoresistive effect element.

A magnetoresistive element MTJ is an example of the resistance change element in the embodiment described above. The magnetoresistive element MTJ includes a stack structure in which a storage layer (ferromagnetic layer) 1 having perpendicular and variable magnetization, a tunnel barrier layer (insulating layer) 2, and a reference layer (ferromagnetic layer) 3 having perpendicular and invariable magnetization are arranged in this order in a first direction.

Here, the invariable magnetization means that the magnetization direction does not change before and after a writing, and the variable magnetization means that the magnetization direction can change to an opposite direction before and after a writing.

The wiring means a spin transfer writing that passes a spin injection current (spin-polarized electrons) through the magnetoresistive effect element MTJ to apply spin torque to the magnetization of the storage layer 1.

For example, when a spin injection current flows from the storage layer 1 to the reference layer 3, electrons spin-polarized in the same direction as the magnetization of the reference layer 3 are injected into the storage layer 1, and spin torque is applied to the magnetization in the storage layer 1. As a result, the magnetization direction of the storage layer 1 is the same as (parallel to) the magnetization direction of the reference layer 3.

When a spin injection current flows from the reference layer 3 to the storage layer 1, electrons spin-polarized in the direction opposite to the magnetization of the reference layer 3 are brought back into the storage layer 1 among electrons running toward the reference layer 3 from the storage layer 1, and spin torque is applied to the magnetization in the storage layer 1. As a result, the magnetization direction of the storage layer 1 is opposite to (antiparallel to) the magnetization direction of the reference layer 3.

The resistance value of the magnetoresistive effect element MTJ is changed by the magnetoresistive effect depending on the relative magnetization directions of the reference layer 3 and the storage layer 1. That is, the resistance value of the magnetoresistive effect element MTJ is low in the parallel state, and is high in the antiparallel state. The value defined by $(R1-R0)/R0$ is called a magnetoresistive (MR) ratio, wherein $R0$ is a resistance value in the parallel state, and $R1$ is a resistance value in the antiparallel state.

The magnetization of the reference layer 3 is fixed toward the storage layer 1 in this example, but may be fixed in a direction opposite to the storage layer 1. When the magnetoresistive effect element MTJ is disposed on a semiconductor substrate, whether the reference layer 3 or the storage layer 1 is located at the top or bottom is not limited.

For example, the magnetoresistive effect element MTJ is called a top pin type when the reference layer 3 is located above the storage layer 1, and the magnetoresistive effect element MTJ is called a bottom pin type when the reference layer 3 is located under the storage layer 1.

FIG. 16 shows a magnetoresistive effect element having a shift correction layer.

A magnetoresistive effect element MTJ includes a stack structure in which a storage layer (ferromagnetic layer) 1 having perpendicular and variable magnetization, a tunnel barrier layer (insulating layer) 2, and a reference layer (ferromagnetic layer) 3 having perpendicular and invariable magnetization are arranged in this order in a first direction.

The magnetoresistive effect element MTJ also includes, on the side of the reference layer 3, a shift correction layer (ferromagnetic layer) 4 having perpendicular and invariable magnetization. A nonmagnetic layer (e.g. metallic layer) 5 is disposed between the reference layer 3 and the shift correction layer 4.

In this example, the reference layer 3 and the storage layer 1 have perpendicular magnetization. In this case, a leakage magnetic field from the reference layer 3 is in the magnetization direction (perpendicular direction) of the storage layer 1. Therefore, a leakage magnetic field having a large perpendicular component is applied to the storage layer 1. This leakage magnetic field acts in such a direction as to cause the magnetization direction of the storage layer 1 to be the same as (parallel to) the magnetization direction of the reference layer 3.

Therefore, the RH curve of the storage layer 1 is shifted.

That is, it is only necessary to pass a low spin injection current through the magnetoresistive effect element MTJ in order to change the magnetoresistive effect element MTJ from the antiparallel state to the parallel state, whereas it is necessary to pass a high spin injection current through the magnetoresistive effect element MTJ in order to change the magnetoresistive effect element MTJ from the parallel state to the antiparallel state.

The antiparallel state is unstable due to the leakage magnetic field from the reference layer 3.

That is, if the leakage magnetic field is greater than the coercive force of the storage layer 1, the storage layer 1 cannot maintain the antiparallel state. Even when the leakage magnetic field is smaller than the coercive force of the storage layer 1, the magnetization of the storage layer 1 may be switched from the antiparallel state to the parallel state by the leakage magnetic field considering the fluctuation of the magnetization caused by thermal disturbance.

The shift correction layer 4 is provided to solve this problem.

In this example, the reference layer 3 and the shift correction layer 4 are stacked on each other. In this case, the magnetization direction of the shift correction layer 4 is set to be opposite to the magnetization direction of the reference layer 3. As a result, in the storage layer 1, the leakage magnetic field from the reference layer 3 can be offset by a correction magnetic field from the shift correction layer 4, and the shift of the RH curve of the storage layer 1 can be corrected.

FIG. 17 shows a memory cell array of a magnetic random access memory.

The reference signs in FIG. 17 correspond to the reference signs in FIG. 1, FIG. 2, FIG. 5, FIG. 12, and FIG. 13.

A memory cell array 10 includes arrayed memory cells MC.

One memory cell MC includes one magnetoresistive effect element MTJ and one select transistor ST that are connected in series.

The memory cells MC are connected between bit lines BL and bBL. In this example, one end of each memory cell MC on the side of the magnetoresistive effect element MTJ is connected to the bit line BL, and one end of each memory cell MC on the side of the select transistor ST is connected to the bit line bBL.

The bit lines BL and bBL extend in a column direction, and are connected at one end to a write buffer 13/a sense amplifier 15. The write buffer 13 passes a spin injection current (which changes in direction depending on the value of write data) through, for example, the magnetoresistive effect element MTJ in one selected memory cell MC in a writing.

A control terminal (gate electrode) of each memory cell MC on the side of the select transistor ST is connected to a word line WL. The word line WL extends in a row direction, and is connected at one end to a row decoder 11a. The row decoder 11a activates, for example, the word line WL connected to one selected memory cell MC in a writing.

The present embodiment is applicable to the magnetic random access memory described above.

CONCLUSION

As described above, according to the present embodiment, a read time can be reduced, and a current consumed in a read operation can be reduced.

Each of elements in the resistance change memory, for example, the sense amplifier is disclosed in U.S. Pat. No. 7,649,792, and U.S. Patent publication No. 2012/0,286,339, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a memory cell array including blocks arranged in a column direction;
   first and second main global conductive lines each extending through the memory cell array from a first end to a second end of the memory cell array in the column direction;
   first and second local conductive lines each extending in the column direction and a plurality of first resistance change elements, each of the plurality of first resistance change elements being provided as a memory cell and being connected between the first and second local conductive lines in a respective one of the blocks, the first local conductive line being connected to the first main global conductive line, and the second local conductive line being connected to the second main global conductive line;
   a first reference global conductive line extending through the memory cell array from the first end to the second end of the memory cell array in the column direction;
   a second resistance change element as a reference cell connected to the first reference global conductive line outside of the memory cell array, the second resistance change element being configured as a single reference cell and being connected to the first reference global conductive line which is configured as a single conductive line;
   a sense amplifier which is connected to the first main global conductive line and the first reference global conductive line, which is separately provided from the memory cell array and the second resistance element, and which reads data from the respective first resistance change elements by comparing a first read current flowing in the respective first resistance change elements with a second read current flowing in the second resistance change element in a reading operation; and
   a second reference global conductive line extending from the first end to the second end of the memory cell array in the column direction,
   wherein the second resistance change element is connected between the first and second reference global conductive lines.

2. The memory of claim 1, wherein
   the sense amplifier is disposed at the first end of the memory cell array in the column direction, and
   the second resistance change element is disposed at the second end of the memory cell array in the column direction.

3. The memory of claim 1, wherein the sense amplifier and the second resistance change element are disposed at the first end of the memory cell array in the column direction.

4. The memory of claim 1, wherein the first and second reference global conductive lines are not connected to local conductive lines corresponding to the first and second local conductive lines in the memory cell array, respectively.

5. The memory of claim 1, wherein the first and second main global conductive lines and the first and second reference global conductive lines are disposed in a single wiring layer.

6. The memory of claim 5, wherein the single wiring layer includes a first power supply line having a power supply voltage, and a second power supply line having a ground voltage.

7. The memory of claim 1, wherein load capacities of the first and second reference global conductive lines are substantially equal to load capacities of the first and second main global conductive lines.

* * * * *